US007799991B1

(12) United States Patent
Advey

(10) Patent No.: US 7,799,991 B1
(45) Date of Patent: Sep. 21, 2010

(54) BUS BAR POSITION ASSURANCE DEVICE

(75) Inventor: Alexander Joseph Advey, Ypsilanti, MI (US)

(73) Assignee: Yazaki North America, Inc., Canton, MI (US)

( * ) Notice: Subject to any disclaimer, the term of this patent is extended or adjusted under 35 U.S.C. 154(b) by 497 days.

(21) Appl. No.: 11/979,087

(22) Filed: Oct. 31, 2007

(51) Int. Cl.
*H02G 3/08* (2006.01)
*H05K 5/03* (2006.01)

(52) U.S. Cl. .......................... 174/50; 174/520; 174/59; 174/67; 439/535; 439/536; 361/600

(58) Field of Classification Search ............... 174/71 B, 174/70 B, 135, 88 B, 70 C, 96, 97, 99 R, 174/99 B, 72 B, 66, 67, 68.1, 68.2, 68.3, 174/50, 520, 53, 57, 58, 59; 439/752, 595, 439/586, 723, 701, 924, 732, 374, 144, 143, 439/535, 536, 949, 76.1, 76.2, 352, 489, 439/140; 361/600, 601, 611, 624, 637, 648
See application file for complete search history.

(56) References Cited

U.S. PATENT DOCUMENTS 4,557,542 A * 12/1985 Coller et al. ................ 439/595
4,870,395 A 9/1989 Belano
5,071,369 A * 12/1991 Denlinger et al. ........... 439/595
5,103,216 A 4/1992 Sisselman
5,191,855 A 3/1993 Conforti
5,280,273 A 1/1994 Goldstein
5,328,382 A * 7/1994 Pawlicki ..................... 439/595
5,344,347 A 9/1994 Inoue et al.
5,738,542 A * 4/1998 Jakobeit et al. ............. 439/595
5,795,193 A 8/1998 Yang
5,820,406 A 10/1998 Hetherington
5,964,621 A * 10/1999 Wolla et al. ................. 439/595
5,989,066 A * 11/1999 Cox ........................... 439/595
6,160,487 A 12/2000 DeLuca
6,176,745 B1 1/2001 Furutani
6,402,573 B1 6/2002 Yeomans
6,409,525 B1 * 6/2002 Hoelscher et al. ........... 439/140
6,780,045 B2 * 8/2004 Shuey et al. ................ 439/489
6,811,424 B2 * 11/2004 Seminara et al. ............ 439/352
6,814,606 B2 11/2004 Kobayashi

* cited by examiner

*Primary Examiner*—Angel R Estrada
(74) *Attorney, Agent, or Firm*—Daniel R. Edelbrock

(57) ABSTRACT

A power distribution box has a holder with inner, deflectable lock arms for securing bus bars within the holder. When the bus bars are correctly and completely installed within the holder, engaging portions of the lock arms are received in apertures of the bus bars and the lock arms are in a locked position. A cover can fit over and properly seat on the holder. The cover has projections that slide behind the lock arms and retain the lock arms in the locked position, preventing further movement. The projections each include a blocking surface. If one or more of the bus bars are not correctly and completely installed in the holder, the related latch arms are in a deflected, unlocked position. The blocking surface of a corresponding projection abuts against the deflected lock arm and prevents proper and complete assembly of the cover onto the holder.

17 Claims, 5 Drawing Sheets

BUS BAR POSITION ASSURANCE DEVICE

BACKGROUND OF THE INVENTION

1. Field of the Invention

The invention relates in general to power distribution boxes and more specifically to a cover feature that assures correct and complete assembly of bus bars into the power distribution box.

2. Discussion of Related Art

Power distribution boxes are often used in vehicles to connect battery power to various electrical components while streamlining wiring. Bus bars within the power distribution boxes distribute power from one or two power input wires routed from the battery to many power output lines routed to the components, eliminating the need for wiring from the battery to each individual component. In typical power distribution boxes, apertures in the bus bars mate with locking protrusions inside the box to retain the bus bars in an operative location. Covers on the boxes are usually used mainly to protect against outside contaminants such as dirt and moisture.

Electrical terminal position assurance features or mechanisms are generally used with electrical connectors to ensure that terminals on the ends of electrical wires are locked in proper position within electrical connectors. These terminal position assurance mechanisms are typically relatively smaller-sized secondary devices that only lock into correct position within the connectors when the terminals are fully seated in terminal accommodating chambers inside the connectors. Sometimes the devices act directly on shoulders of the terminals to hold them in the chambers.

In some types of battery-powered detecting or sensing units, such as smoke detectors, covers are used as operation indicators. For example, retaining members for the battery are sometimes used to block latching of a cover onto the unit if the battery is missing or incorrectly inserted.

SUMMARY OF THE INVENTION

Accordingly, it is an object of this invention to prevent incorrect or incomplete assembly of bus bars into a power distribution box.

Another object of this invention is to incorporate a bus bar position assurance feature into a cover of the power distribution box.

A further object of the invention is to prevent any bus bar movement after the cover is assembled on the power distribution box.

In carrying out this invention in the illustrative embodiment thereof, a power distribution box has a holder for receiving bus bars. The holder has deflectable lock arms that include catch portions for being received in locking apertures of the bus bars. A cover for the power distribution box has an underside with projections. The projections include surfaces for sliding behind the lock arms when the catch portions are fully received in the bus bar apertures. This retains the lock arms in position and prevents further bus bar movement. If the catch portions of the lock arms are not completely received in the bus bar locking apertures, other surfaces on the cover projections abut against the free ends of the deflected lock arms and obstruct complete assembly of the cover on the holder.

In other words, the cover cannot be snapped onto the holder unless the lock arms are in a fully seated position relative to the bus bars. This prevents disassembly or incomplete assembly of the bus bars into the power distribution box because the assembly of the next part in the sequence, the cover, is not possible if the bus bars are not seated and locked properly or completely.

BRIEF DESCRIPTION OF THE DRAWINGS

This invention, together with other objects, features, aspects and advantages thereof, will be more clearly understood from the following description, considered in conjunction with the accompanying drawings.

DETAILED DESCRIPTION OF THE ILLUSTRATED EMBODIMENT

Figure 1:
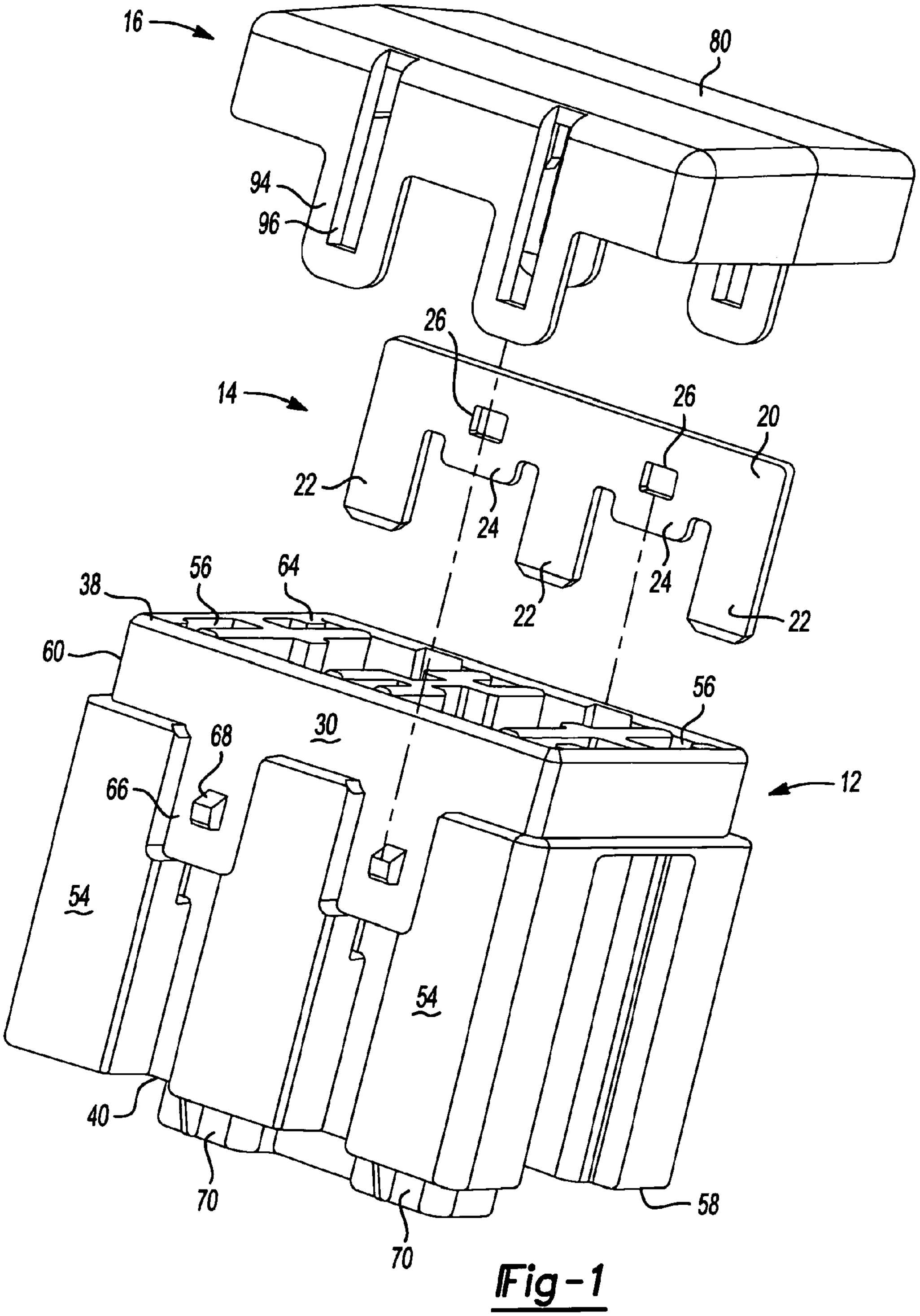
FIG. 1 is an exploded perspective view of a power distribution box according to the present invention, including a holder, bus bar and cover.

Referring now to FIG. 1, a power distribution box according to the present invention includes an insulation shell or holder 12, at least one bus bar 14, and a cap or cover 16. The holder and cover are injection molded from an electrically non-conductive thermoplastic, for example polybutylene terephthalate reinforced with glass fibers at fifteen percent content. The bus bars would be stamped or otherwise formed from an electrically conductive metal, such as tin-plated copper.

The illustrated bus bar 14 has a base section 20. Three electrical contact sections 22, shown as flat male contact blades, are integral with and extend from the base section 20. The bus bar 14 is narrow in cross-section and substantially flat. The base and contact sections are in the same plane, with the contact sections 22 being spaced apart and extending at right angles from a common edge of the base section 20 along a longitudinal length of the base section. A seat portion 24 protrudes from the base section 20 between each contact section 22. Locking apertures 26 are located in the base section 20 inward from each seat section 24 and centrally placed between the positions where the contact sections 22 extend from the base section.

The insulation shell or holder 12 receives the bus bars 14 and electrical terminals for connection to the bus bars. The illustrated power distribution box could be used as a splitter, for example. Positive and negative power cables from a vehicle battery would be routed to the sides of the box. On one side of the box, a positive power cable terminated with a female terminal would fit into the box and receive a male blade 22 of the bus bar 14. Female terminals on other electrical wires would each receive the other two blades 22 of the bus bar so power could be routed away from the box to electrical components within the vehicle. A bus bar 14 on the opposite side of the box would split the negative power cable in the same manner. The male contact blades 22 are meant as an example. Alternatively, the bus bar 14 could have integral female contact sections, and the battery cables and electrical wires could be terminated by male terminals.

Figure 2:
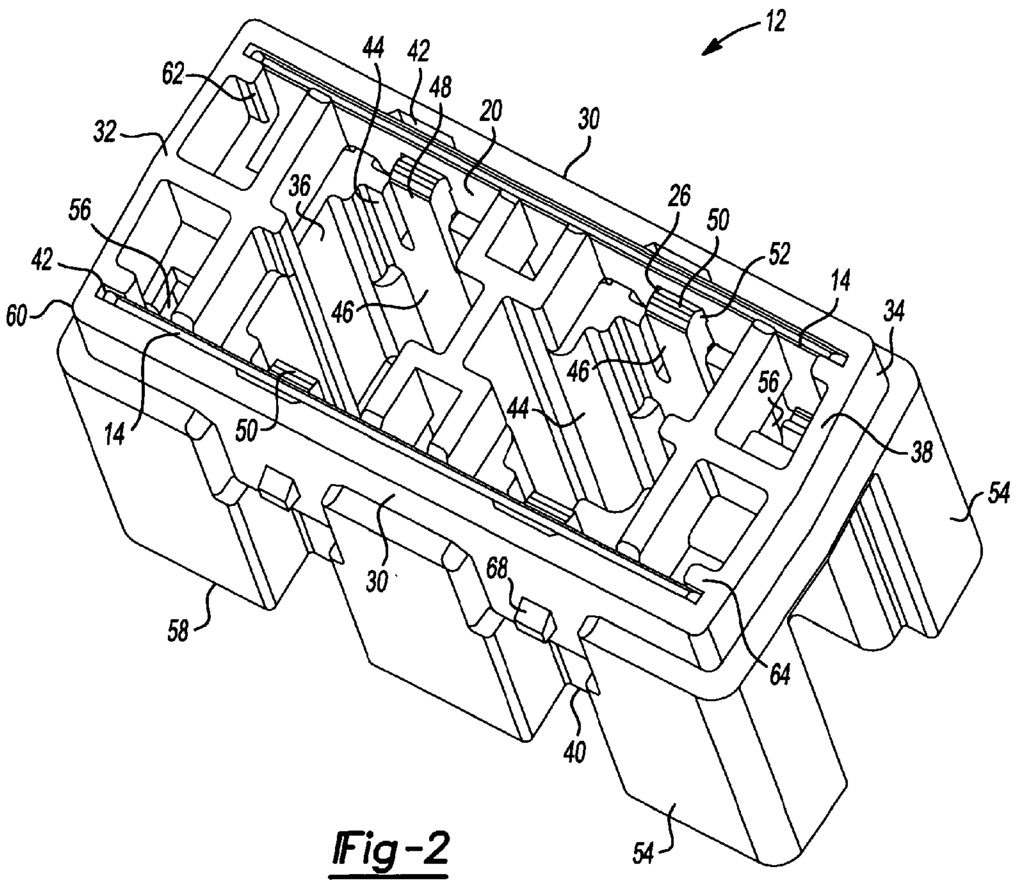
FIG. 2 is a perspective view of the power distribution box holder with multiple bus bars inserted and locked.

The insulation shell or holder 12, as best shown in FIG. 2, has two sides 30 stretching between ends 32 and 34 and enclosing an interior cavity 36. The interior cavity is open at a top 38 of the holder and continues to a bottom 40 of the holder. The illustrated holder has two long, narrow receptacles 42. Each receptacle 42 is parallel and immediately adjacent to a side 30 on an outer boundary or perimeter of the cavity 36. The interior cavity 36 includes various inner partitions and struts 44 for strength and for supporting two inner deflectable lock arms 46 located on each side 30 of the holder. The lock arms 46 have free ends 48 extending toward the top 38 of the holder. The free ends 48 each have a rounded surface 50 and an engaging pawl or catch portion 52 sized to be received in the locking apertures 26 of the bus bars.

The holder 12 has three columns 54 on each side 30 forming a total of six terminal accommodating chambers 56. The chambers 56 are configured to receive female electrical terminals on the ends of battery cables from the battery and on the ends of electrical wires routed from various electrical components in the vehicle through openings 58 adjacent the bottom 40 of the holder. The chambers 56 also communicate or connect with the receptacles 42 such that the contact sections 22 of the bus bars 14 also enter the chambers 56 to mate with the cable and wire terminals. There may be additional columns 54 corresponding to additional contact sections 22 of the bus bars depending on the size and electrical requirements of the power distribution box.

Near each corner 60, formed where the sides 30 meet the ends 32, 34, the holder 12 has inner posts 62. The posts 62 have upper surfaces 64 at the top 38 of the holder. Vertical outer channels 66 on the sides 30 of the holder 12 between the columns 54 have protruding tabs 68. There are two tabs 68 on each side 30. The tabs 68 are spaced a predetermined distance down from the top 38 of the holder. The holder also has tie-down compartments 70 protruding from the bottom 40. The tie-down compartments 70 receive inner fasteners (not shown), such as bolts or clips inserted through the interior cavity 36, for anchoring the holder onto an inner panel or brace within an engine compartment of the vehicle.

Figure 3:
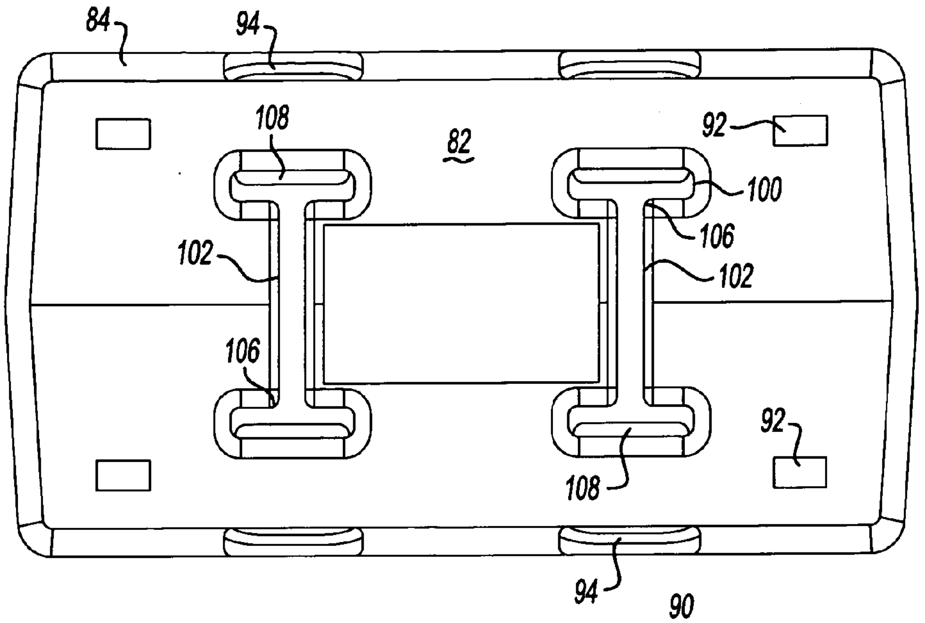
FIG. 3 is an underside view of the power distribution box cover.
Figure 4:
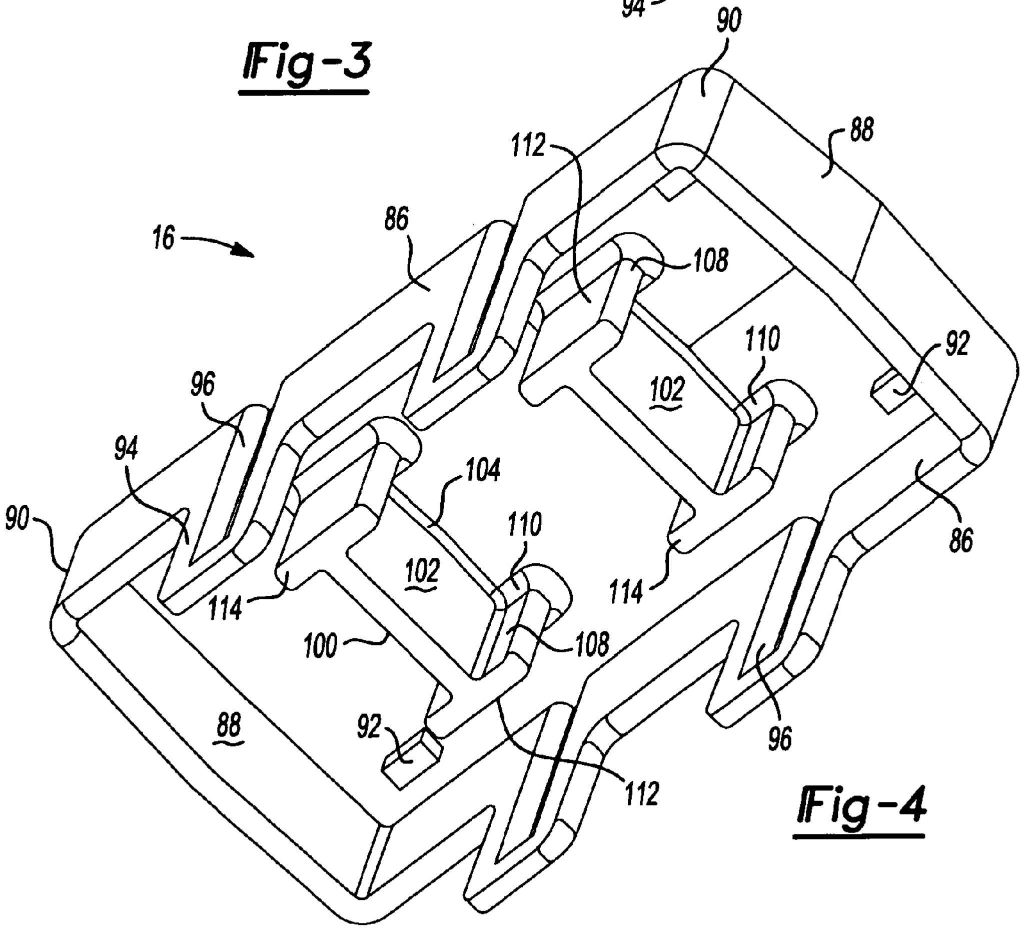
FIG. 4 is an underside, perspective view of the cover.
Figure 5:
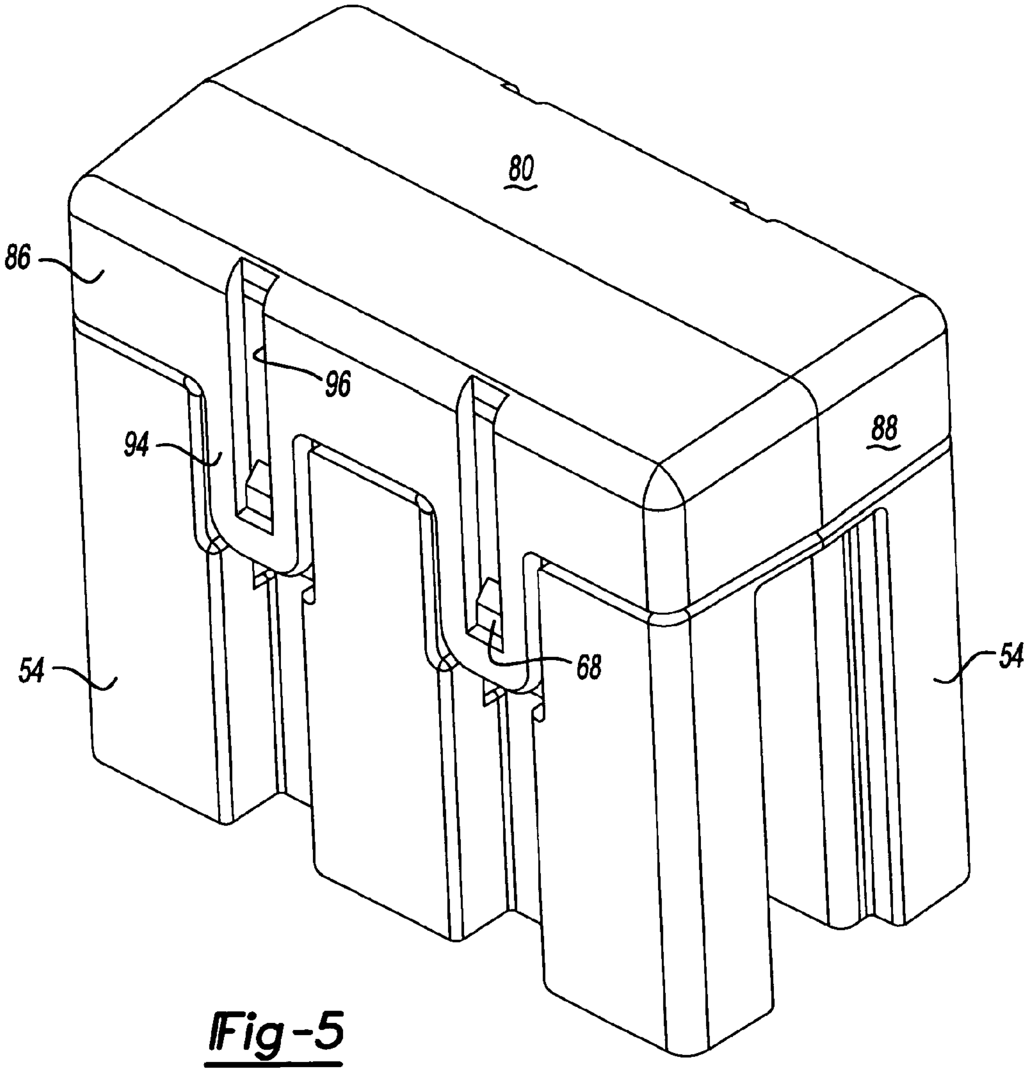
FIG. 5 is an assembled view of the power distribution box.
Figure 6:
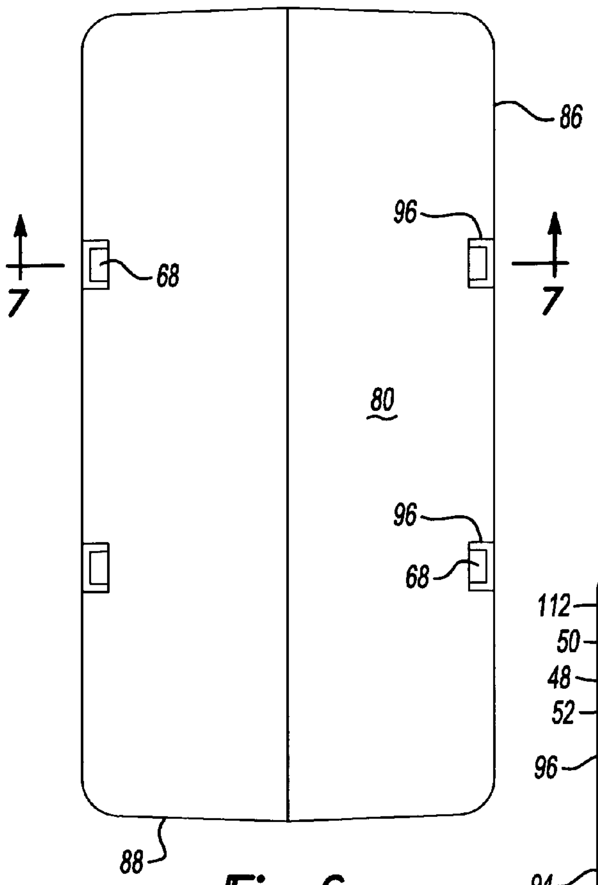
FIG. 6 is a top view of the assembled power distribution box.

The cover 16 has a top surface 80 and, as best shown in FIGS. 3 and 4, an underside 82 recessed within an outer perimeter or rim 84 extending perpendicularly down or away from outer edges of the top surface. The rim 84 has two long sides 86 meeting relatively shorter ends 88 at corners 90. The rim is sized to snugly fit around the sides 30 and ends 32, 34 of the holder 12. Protruding from the underside 82 of the cover 16 near each corner 90 are small rectangular stops 92. The rim sides 86 have downwardly extending brackets 94 with inner slots 96. The brackets 94 are sized to slide into the vertical outer channels 66 on the sides 30 of the holder 12 until the brackets flex and the slots 96 snap over the protruding tabs 68 to lock the cover 16 on the holder. This happens simultaneously with the stops 92 abutting against the upper surfaces 64 of the inner posts 62 of the holder 12, so the cover is securely held against further downward movement or vibration on the holder. The completed power distribution box assembly is illustrated in FIG. 5.

integral with and extending perpendicularly away from the underside 82 are two I-shaped projections 100. The projections 100 each have relatively long stem sections or stems 102 extending across or perpendicular to a longitudinal length of the cover, parallel to a width of the cover. The stems 102 are flat and planar and joined to the underside at a long edge 104. At each end 106 of each stem 102 are relatively shorter, planar cross-piece sections or cross-pieces 108 extending parallel to the longitudinal length of the cover, perpendicular to the width. The cross-pieces 108 are also flat and planar and are joined to the underside 82 at edges 110 such that each projection 100 resembles a capital resting on its back. Cross-pieces 108 each have a first, planar pressing surface 112 facing outward toward the rim 84 and a second, blocking surface 114 distal from and facing away from the underside 82. The pressing surface 112 and the blocking surface 114 are at right angles to each other. There may be additional projections 100 depending on the number of lock arms 46 designed into the power distribution box.

Figure 7:
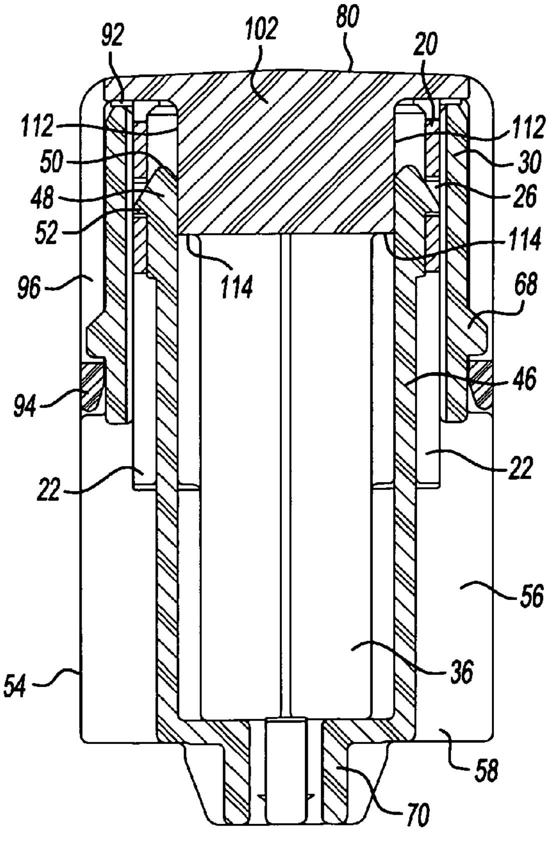
FIG. 7 is a cross-section of the assembled power distribution box, taken on section line 7-7 of FIG. 6.

As best depicted in the FIG. 7 cross-section view, when the bus bars 14 are correctly and completely installed in the holder 12 with the seating portions 24 resting on corresponding shoulders within the holder, the engaging portions 52 of the lock arms 46 are received in the locking apertures 26 of the bus bars and the lock arms are in a locked condition. When the cover 16 is assembled on the holder 12, the projections 100 are not obstructed by the lock arms 46 and the brackets 94 receive the tabs 68. The pressing surface 112 of each cross-piece 108 slides behind and presses against a lock arm 46 to secure the lock arm in the locked condition, thwarting any further movement of the bus bar.

If the engaging portions 52 of the lock arms 46 are not completely received by the locking apertures 26 of the bus bars 14, then it is likely that the bus bars have not been correctly or completely inserted into the receptacles 42 of the holder 12. The lock arms 46 will be in an unlocked, deflected condition. Attempts to latch the cover 16 on the holder 12 will cause the blocking surfaces 114 of the cross-pieces 108 of the projections 100 to abut against the rounded surfaces 50 on the free ends 48 of the lock arms 46, preventing the slots 96 in the brackets 94 of the cover from receiving the tabs 68 of the holder. This indicates to the assembler that the bus bars 14 must be realigned with or further inserted into the holder 12 in order to assemble the cover 16 on the holder.

Since minor changes and modifications varied to fit particular operating requirements and environments will be understood by those skilled in the art, this invention is not considered limited to the specific examples chosen for purposes of illustration. The invention is meant to include all changes and modifications which do not constitute a departure from the true spirit and scope of this invention as claimed in the following claims and as represented by reasonable equivalents to the claimed elements.

What is claimed is:

1. A cover for a power distribution box, the power distribution box including at least one lock arm for latching at least one bus bar within the box, the cover comprising:

an underside; and at least one projection extending from the underside, the projection having a first surface for holding the at least one lock arm in place when the at least one lock arm latches the at least one bus bar within the power distribution box in a correct position, the projection further having a second surface for abutting against the at least one lock arm when the at least one lock arm does not latch the at least one bus bar in the correct position in the power distribution box, whereby the cover is prevented from being completely assembled on the box, and wherein the first and second surfaces of the projection are perpendicular to one another.

2. The cover of claim 1 wherein the projection is sized to extend across a width of the underside of the cover for engaging bus bar lock arms on each side of the power distribution box.

3. The cover of claim 1 wherein there are multiple projections spaced along a length of the underside of the cover for engaging a number of bus bar lock arms.

4. The cover of claim 1 further comprising brackets on the cover for receiving corresponding tabs on the power distribution box when the first surface of the projection holds the at least one lock arm in place.

5. A cover for a power distribution box, the power distribution box including at least one lock arm for latching at least one bus bar within the box, the cover comprising:

an underside; and at least one projection extending from the underside, the projection having a first surface for holding the at least one lock arm in place when the at least one lock arm latches the at least one bus bar within the power distribution box in a correct position, the projection further having a second surface for abutting against the at least one lock arm when the at least one lock arm does not latch the at least one bus bar in the correct position in the power distribution box, whereby the cover is prevented from being completely assembled on the box, and wherein the projection has a stem section extending across a width of the underside of the cover and a relatively shorter section at each end of the stem section extending at a right angle to the stem section along a length of the underside of the cover.

6. The cover of claim 5 wherein the first and second surfaces of the projection are perpendicular to one another.

7. The cover of claim 5 wherein each section of the projection is substantially planar.

8. A power distribution box comprising:

a holder having at least one receptacle and at least one deflectable lock arm adjacent the at least one receptacle, the at least one lock arm having a free end with an engaging portion;

at least one bus bar, the at least one bus bar having a base section and multiple contacts extending from the base section, the base section including at least one locking aperture, the at least one bus bar being sized for insertion into the at least one receptacle with the engaging portion of the at least one lock arm being received in the at least one locking aperture to secure the at least one bus bar in the holder; and a cover for the holder and the at least one receptacle, the cover having a projection for sliding behind the at least one lock arm when the engaging portion is received in the at least one locking aperture and the cover is properly fit on the holder, the projection having a central planar stem extending across an underside of the cover perpendicular to a length of the cover and a planar section at each end of the stem, the planar sections being perpendicular to the stem and extending along the length of the cover, the projection further having a blocking surface for abutting against the free end of the at least one lock arm when the engaging portion is not fully received in the at least one locking aperture to prevent the cover from properly fitting on the holder.

9. The power distribution box of claim 8 wherein the at least one bus bar has first, second and third contacts extending from a common edge of the base section along a length of the base section.

10. The power distribution box of claim 9 wherein the at least one locking aperture in the base section is in a location between where the first and second contacts extend from the base section.

11. The power distribution box of claim 10 further comprising another locking aperture in the base section in a location between where the second and third contacts extend from the base section.

12. The power distribution box of claim 11 further comprising a seat portion extending from the common edge of the base section adjacent each locking aperture and between each contact.

13. The power distribution box of claim 11 wherein the holder has two sides, at least one of the sides having two deflectable lock arms with engaging portions for receipt in the two locking apertures of the bus bar.

14. The power distribution box of claim 13 wherein both sides have two deflectable lock arms, such that two bus bars are received and locked in the holder.

15. The power distribution box of claim 8 wherein the planar sections are relatively short as compared to a length of the stem, giving the projection an I-shaped configuration.

16. The power distribution box of claim 15 wherein there are two projections spaced along the length of the cover for acting against two deflectable lock arms on each side of the holder.

17. The power distribution box of claim 8 further comprising brackets protruding from opposite sides of the cover for clasping tabs on opposite sides of the holder when the cover is properly fit on the holder.

* * * * *